(12) United States Patent
Livshits et al.

(10) Patent No.: US 6,489,590 B2
(45) Date of Patent: *Dec. 3, 2002

(54) LASER REMOVAL OF FOREIGN MATERIALS FROM SURFACES

(76) Inventors: Boris Buyaner Livshits, 20/13 Yasmin Street, Carmiel (IL), 21940; Menachem Genut, 51 Leah Street, Haifa (IL), 34815; Ofer Tehar-Zahav, 28 Binyamin Avenue, Natania (IL), 42311; Eliezer Iskevitch, 1711 Anthandiah Street, Kiryat-Mozkin (IL), 26361

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,990

(22) Filed: Mar. 11, 1999

(65) Prior Publication Data

US 2001/0050272 A1 Dec. 13, 2001

Related U.S. Application Data

(63) Continuation of application No. PCT/IL97/00271, filed on Aug. 11, 1997.

(30) Foreign Application Priority Data

Sep. 12, 1996 (IL) .................................................. 119246

(51) Int. Cl.$^7$ ............................................. B23K 26/00
(52) U.S. Cl. ............................ 219/121.84; 219/121.85; 216/65; 134/1
(58) Field of Search ....................... 219/121.69, 121.84, 219/121.85; 216/65; 134/1, 1.3; 427/554, 555, 556

(56) References Cited

U.S. PATENT DOCUMENTS

| | | | | |
|---|---|---|---|---|
| 4,654,115 A | * | 3/1987 | Egitto et al. | 134/1.1 |
| 4,731,158 A | * | 3/1988 | Brannon | 438/708 |
| 4,834,834 A | * | 5/1989 | Ehrlich et al. | 219/121.69 X |
| 5,114,834 A | * | 5/1992 | Nachshon | 216/65 X |
| 5,350,480 A | * | 9/1994 | Gray | |
| 5,499,668 A | * | 3/1996 | Katayama et al. | 134/1 |
| 5,669,979 A | * | 9/1997 | Elliott et al. | 134/1 |
| 5,716,495 A | * | 2/1998 | Butterbaugh et al. | 134/1 X |
| 5,981,001 A | * | 11/1999 | Komatsu et al. | |

FOREIGN PATENT DOCUMENTS

| | | |
|---|---|---|
| WO | 9507152 | 3/1995 |
| WO | 9717164 | 5/1997 |
| WO | 9717166 | 5/1997 |
| WO | 9717167 | 5/1997 |

* cited by examiner

*Primary Examiner*—Gregory Mills
(74) *Attorney, Agent, or Firm*—Baker Botts L.L.P.

(57) ABSTRACT

A method of fast and complete laser removal of inorganic and organic foreign material, including particles down to submicron-sizes and atomic contaminants, such as heavy metals and alkaline elements, from a substrate without any damage to the substrate, carried out by UV laser irradiation of the substrate surface in a reactive oxygen based gas, which comprises carrying out the removal process in the presence of gas containing F and/or Cl atoms in its molecules.

18 Claims, 2 Drawing Sheets

LASER REMOVAL OF FOREIGN MATERIALS FROM SURFACES

This is a continuation of International Application PCT/IL97/00271 filed Aug. 11, 1997, which is incorporated herein by reference.

FIELD OF INVENTION

The present invention relates to U.V. laser surface treatment methods, more particularly to removal of any foreign materials from substrate surfaces. For example, such a treatment is the complete stripping of photoresists or the removal of any foreign materials, including those on side walls, formed during Reactive Ion Etching (RIE) or High Dose Ion Implantation (HDI) processes, common in the VLSI/ULSI (Very/Ultra Large Scale Integration) circuits industry. The invention also includes the removal of particles down to sub-micron sizes and atomic contaminants, such as heavy metals and alkaline elements, from substrate surfaces.

BACKGROUND OF THE INVENTION

In the manufacturing of various products it is necessary to apply a layer of protective material on a surface, which must be removed after a specified manufacturing step has been concluded. An example of such process is the so-called "photolithography" process, which is widely used in the manufacturing of integrated circuits. In this process, a pattern is created on a surface using a layer of protective material illuminated through a mask, and the surface is then treated with a developer which removes material from the unmasked portions of the surface, therefore leaving a predetermined pattern. The surface is then treated by ion implantation or by etching agents, which introduce the implanted species into, or removes material from, the unmasked portions of the surface. Once these processes are completed, the role of the protecting mask ends and it must be removed. The process is conventional and well known in the art, and is described, e.g., in R. K. Watts, "Lithography", VLSI/ULSI Technology, S. M. Sze, ed., McGraw-Hill, New York, 1988, Chpt. 4.

Two main photoresist stripping methods are known in the modern VLSI/ULSI circuits industry (see D. L. Flamm, "Dry PlasmaResist Stripping", Parts 1, 2 and 3; Solid State Technology, August, September and October 1992):

1) Wet stripping which uses acids or organic solvents;
2) Dry stripping, which uses plasma, $O_3$, $O_3/N_2O$ or $UV/O_3$-based stripping.

Both methods are problematic and far from being complete, especially when taking into consideration the future miniaturization in the VLSI/ULSI industry. The current technology is capable of dealing with devices having feature sizes of about 0.5 $\mu$m, but the workable size of the devices is expected to be reduced before the end of the century to 0.25 $\mu$m. The expected size changes require considerable changes in the manufacturing technology, particularly in the stripping stage. The prior art photoresist stripping techniques, described above, will be unsuitable for future devices, as explained hereinafter.

Utilizing only the wet stripping method is not a perfect solution, as it cannot completely strip photoresist after tough processes that change the chemical and physical properties of the photoresist in a way that it makes its removal very difficult. Such processes include, e.g., High Dose Implantation (HDI), reactive Ion Etching (RIE), deep UV curing and high temperatures post-bake. After HDI or RIE, the side walls of the implanted patterns or of the etched walls are the most difficult to remove.

In addition, the wet method has some other problems: the strength of stripping solutions changes with time, the accumulated contamination in solutions can be a source of particles which adversely affect the performance of the wafer, the corrosive and toxic content of stripping chemicals imposes high handling and disposal costs, and liquid phase surface tension and mass transport tend to make photoresist removal uneven and difficult.

The dry method also suffers from some major drawbacks, especially from metallic and particulate contamination, damage due to plasma: charges, currents, electric fields and plasma-induced UV radiation, as well as temperature-induced damage, and, last but not least, it suffers from incomplete removal. During various fabrication stages, as discussed above, the photoresist undergoes chemical and physical changes which harden it, and this makes the stripping processes of the prior art extremely difficult to carry out. Usually a plurality of sequential steps, involving wet and dry processes are needed to remove completely the photoresist.

The art has addressed this problem in many ways, and commercial photoresist dry removal apparatus is available, which uses different technologies. For instance, UV ozone ashers are sold, e.g. by Hitachi, Japan (UA-3150A). Dry chemical ashers are also available, e.g., by Fusion Semiconductor Systems, U.S.A., which utilize nitrous oxide and ozone to remove the photoresist by chemical ashing at elevated temperatures. Microwave plasma ashing is also effected, e.g., as in the UNA-200 Asher (ULVAC Japan Ltd.). Also plasma photoresist removal is employed and is commercially available, e.g., as in the Aspen apparatus (Mattson Technology, U.S.A.), and in the AURA 200 (GASONICS IPC, U.S.A.).

More recently, photoresist removal has been achieved by ablation, using laser UV radiation, in an oxidizing environment, as described in U.S. Pat. No. 5,114,834. The ablation is due to strong absorption of the laser pulse energy by the photoresist. This process is a localized ejection of the photoresist layer to the ambient gas, associated with a blast wave due to the breaking of chemical bonds in the photoresist and instant heating. The partly gasified and partly fragmented photoresist is blown upwards away from the surface, and instantly heats the ambient gas. Fast combustion of the ablation products occurs due to the blast wave, and may also be due to the photochemical reaction of the IN laser radiation and the process gases. The main essence of the process is laser ablation with combustion of the ablated photoresist, which occurs in a reactive gas flowing through an irradiation zone. The combination of laser radiation and fast combustion provides simultaneous lowering of the ablation threshold of hard parts of the photoresist (side walls). The combusted ablation products are then removed by vacuum suction, or by gas sweeping leaving a completely clean surface.

While U.S. Pat. No. 5,114,834 provides an important novel process, it still does not provide a high throughput, which is industrially convenient, viz., an industrially acceptable number of wafers that can be stripped during a given time. The laser stripping throughput is determined by the stripping rate or by the number of laser pulses needed for providing complete stripping of a unit area of the photoresist per unit of time.

International Patent Application No. PCT/IL96/00138, published under the number WO 97/17166, the entire content of which is incorporated herein by reference, discloses a method of accelerating a laser stripping process carried out in a reactive gas mixture, comprising carrying out the stripping process in the presence of an accelerating effective amount of $N_xO_y$ gas, preferably selected from among $N_2O$, NO, $NO_2$, $N_2O_3$, $N_2O_4$ and $NO_3$. The reactive gas mixture may include oxygen or ozone. While oxygen based chemistry provides a good solution for assisting laser removal of organic materials, it does not give a complete answer for removing inorganic based residues with ablation threshold which exceeds the damage threshold of the substrate. Such residues are formed, for example, on side walls during RIE processes as in etching of metal, polysilicon, contacts, and via holes. The oxygen based gas composition described in WO 97/17166 gives atomic oxygen radicals. These radicals cannot break the strong chemical bonds in inorganic materials, as e.g. Si—O, Si—C, Si—Cl or other metal-oxygen bonds. Therefore the removal of the above mentioned residues containing such bonds is one of the challenges in dry stripping. Another challenge is the removal of submicron particles, as well as metallic contaminants, from silicon wafers or from other substrates. This is extremely important for ULSI technology.

While reference will be made throughout this specification to laser removal of foreign materials from semiconductor wafers, this will be done for the sake of simplicity, and because it represents a well known and widely approached problem. It should be understood, however, that the invention described hereinafter is by no means limited to laser removal of foreign materials from wafers, but it applies, *nutatis mutandis*, to many other applications, such as cleaning of foreign materials from different objects such as Flat Panel Displays (FPD), lenses, photo-masks, compact disks, magnetic heads etc.

SUMMARY OF THE INVENTION

It has now surprisingly been found, that addition of gases, the molecules of which contain fluorine and/or chlorine atoms, to the oxygen-based process gases used for laser removal of foreign materials, including particles and atomic contaminants, such as heavy metals, alkaline elements and atomic elements, in the method described in the aforementioned International Publication No. WO 97/17166—which gases contain at least a gas having the formula $N_xO_y$, viz. one or more nitrogen oxides, wherein x and y having the appropriate values for the given oxide or mixtures of the oxides, preferably selected from among $N_2O$, NO, $NO_2$, $N_2O_3$, $N_2O_4$ and $NO_3$, permits the fast and complete removal of inorganic in addition to the organic foreign materials, for example removal of adhesion promoters and/or antireflection coatings used prior to photoresist application. This effect was also proved even for submicron geometries common in modern and future ULSI industry.

Accordingly, the method of accelerating a Laser Removal Process (LRP) carried out in reactive gas mixture, according to the invention, comprises carrying out the stripping process in the presence of an oxygen based gas and of a gas containing fluorine and/or chlorine in its molecule.

At elevated values of laser energy fluence and/or auxiliary gas irradiation by VUV source (vacuum UV, wavelength lower than 180 nm) one can choose an oxygen-based gas consisting of oxygen, ozone, nitrogen oxide ($N_xO_y$) or their mixtures, and a gas containing F and/or Cl atoms in its molecule from among $NF_3$, $SF_6$, $SF_4$, $CF_4$, CF3, NOCl, $Cl_2O$, $F_2O$, HF, $F_2$, $Cl_2$, HCl.

The most preferred gas containing fluorine and/or chlorine atoms in its molecule is nitrogen trifluoride ($NF_3$), due to its lower thermo-dissociation energy. This gas promotes fast and complete laser removal of inorganic foreign materials, including micron and submicron particles and metallic contaminants, as well as preventing any damage to the treated substrates.

DETAILED DESCRIPTION OF PREFERRED EMBODIMENTS

Figure 1:
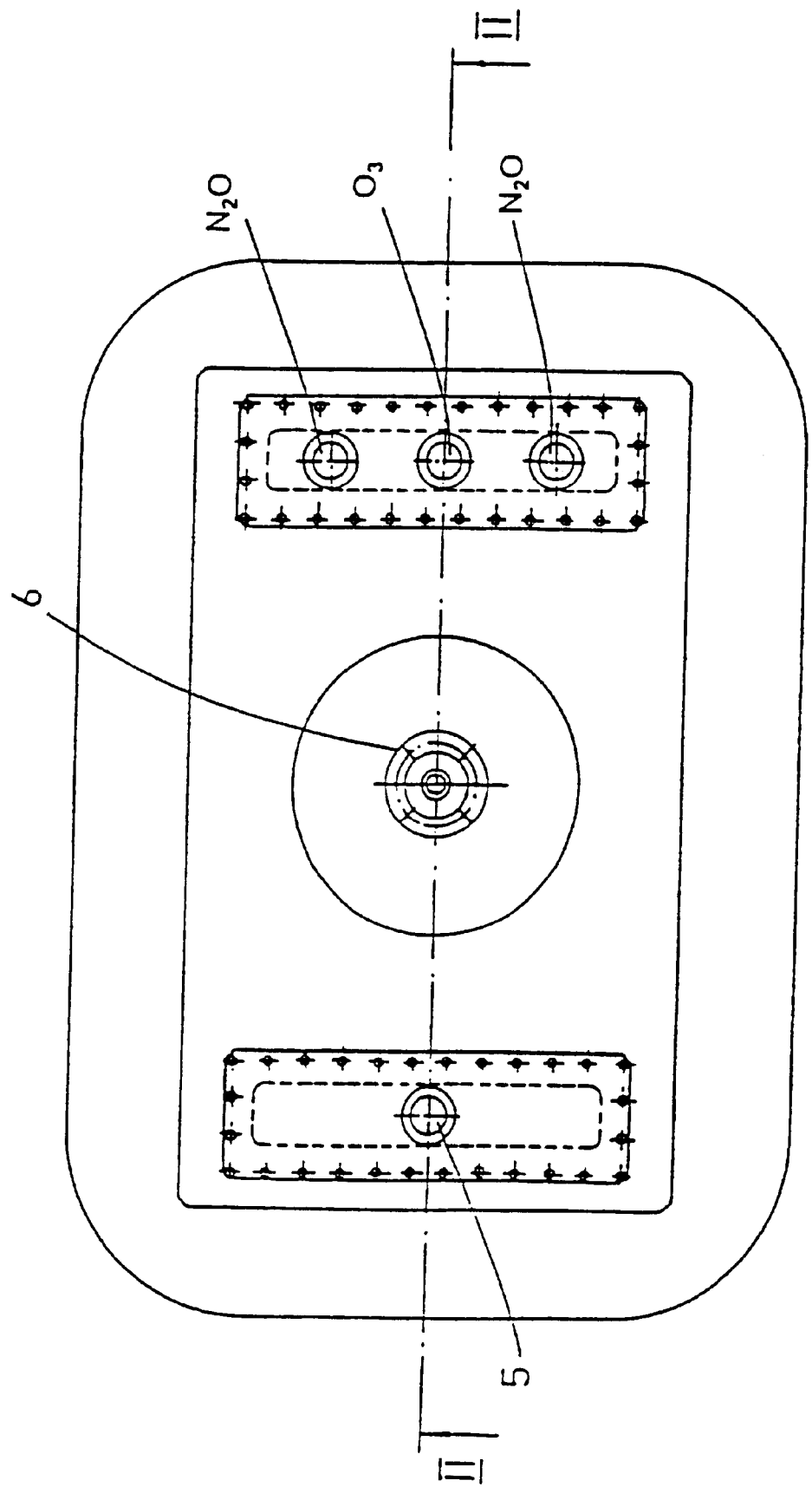
FIG. 1 is a plan view, from the bottom, of a process chamber as described and claimed in the aforementioned International Patent Application of the same applicant, which is preferably used in carrying out the present invention.

The method of laser removal of foreign materials, according to this invention, comprises adding an amount of a gas containing chlorine and/or fluorine in its molecule, preferably nitrogen trifluoride ($NF_3$), to the reactive gas mixture applied in laser stripping, as described in the aforementioned International Publication No. WO 97/17166, whereby to achieve fast and complete removal of the foreign inorganic as well as metalorganic and silicon-organic materials (film, particles down to sub-micron sizes and atomic contaminants) from a wafer.

Decomposition of halogen containing molecules is feasible by photolysis in UV, by plasma electrons and also by thermo-disossociation. In the LPR method, thermo-dissociation is the common way for obtaining primary fluorine or chlorine atoms from appropriate molecules in the process gas irradiated by excimer laser. $NF_3$ is chosen because of its lower $NF_x$—F bond energies in comparison with other fluorine containing molecules, which promotes easier thermo-dissociation. $NF_3$ dissociates effectively already at ~450° C. Since the temperature of the Laser Induced-Gas Medium is higher than 450° C., considerable thermo-dissociation of $NF_3$ will occur.

An additional amount of F atoms is induced by chemical reactions of atomic oxygen with radicals $NF_2$ and NF which are formed as a result of $NF_3$ thermo-dissociation.

The energy fluences used for laser removal of foreign materials are much lower than is required for etching the substrate, being significant for more effective etching of residues and particles. It promotes the following chemical etching by atomic fluorine and facilitates the consequent laser etching of all foreign material. Thus this chemical assisted laser etching (as one of mechanisms of laser removal of foreign materials) determines its selectivity.

An important requirement for any chlorine and/or fluorine containing gas, to be used according to the invention, is its low spontaneous reactivity with the substrate. $NF_3$ satisfies this requirement. One should also emphasize that, as opposed to the plasma stripping method, the process gas in LRP remains without atomic radicals during most of the exposure time. This should also favor the selectivity of the LRP method.

Application of $NF_3$ allows to minimize the degradation of silicon oxide during the LRP, which is especially important for submicron geometry, by lowering the wafer's temperature. For that it is needed to expand a process window by appropriate pulse extension in accordance with the disclosure of International Patent Application No. PCT/IL96/00139, published under the number WO 97/17164. It will provide a damage free surface treatment at elevated fluence values with lower substrate temperature. This latter should decrease the interaction of F atoms with silicon oxide and silicon.

On the other side, the elevated values of fluence should lower the effective concentrations of $NF_3$ and may permit the use of other fluorine containing additives, such as $SF_6$, $SF_4$, $CF_3Cl$, $NOCl$, $Cl_2O$, $F_2O$, $HF$, $F_2$, $Cl_2$, $HCl$, $CF_4$ as well as a number of other molecules containing F and/or Cl.

In addition, a supplementary generation of halogen atoms by photodissociation could be implemented by means of an auxiliary source of VUV-radiation ($\lambda$<180 nm).

One specific embodiment of the invention is the removal of micron and sub-micron particles from substrates, in particular silicon wafer. The removal is effected by laser induced chemical etching followed by laser etching. This process is highly selective.

EXAMPLE 1 (comparative)

A 6" wafer after poly-silicon deposition was covered with a layer of Novolak type positive photoresist, 1.2 $\mu$m thick, patterned by the conventional procedure mentioned hereinbefore, with features size down to 0.35 $\mu$m, and then was subjected to RIE of polysilicon pattern. During the RIE process, the poly-silicon sidewalls, as well as the photoresist, were covered with an silicon-organic polymeric film forming on the so-called sidewalls.

Following the RIE, the wafer was treated in a process chamber. One should understand that the process chamber hereinafter described is only a particular example. Many types of process chambers can be used for the processes described in this specification and the description of a particular chamber does not constitute a limitation or a suggestion that the specific configuration of such a chamber is necessary or required. It should be emphasized that this invention is not limited to any particular shape or size of process chamber, and can be carried out in performing laser treatments on much larger or much smaller surfaces and in process chambers of different shapes and made of different materials.

The process chamber herein exemplified consists of a base and a cover, which are connected by air-tight connections so that the inner part of the process chamber defined by the said base and cover can be kept under pressure or vacuum. The base is provided with $N_xO_y$ gas inlet, and—$O_2/O_3$ inlet, and gas outlet for exhausting gases which have passed through the irradiated zone. The base is further provided with a chuck, on which the element to be stripped, e.g., a wafer, is supported. Through the center of chuck, vacuum is applied, to hold the wafer in place during the process. A fused silica window is provided above the element to be stripped, e.g., a silicon wafer. This window permits the passage of the laser beam, which originates from a source positioned above the chamber. A silica cover frame keeps the silica windows in place, and assists in keeping the chamber pressurized or under vacuum.

Such a chamber is described and claimed in an International Patent Application No. PCT/IL96/00141, published under the number WO 97/17167, the description of which is incorporated herein by reference, and which is briefly described hereinafter, for purposes of illustration, with reference to the drawings.

Figure 2:
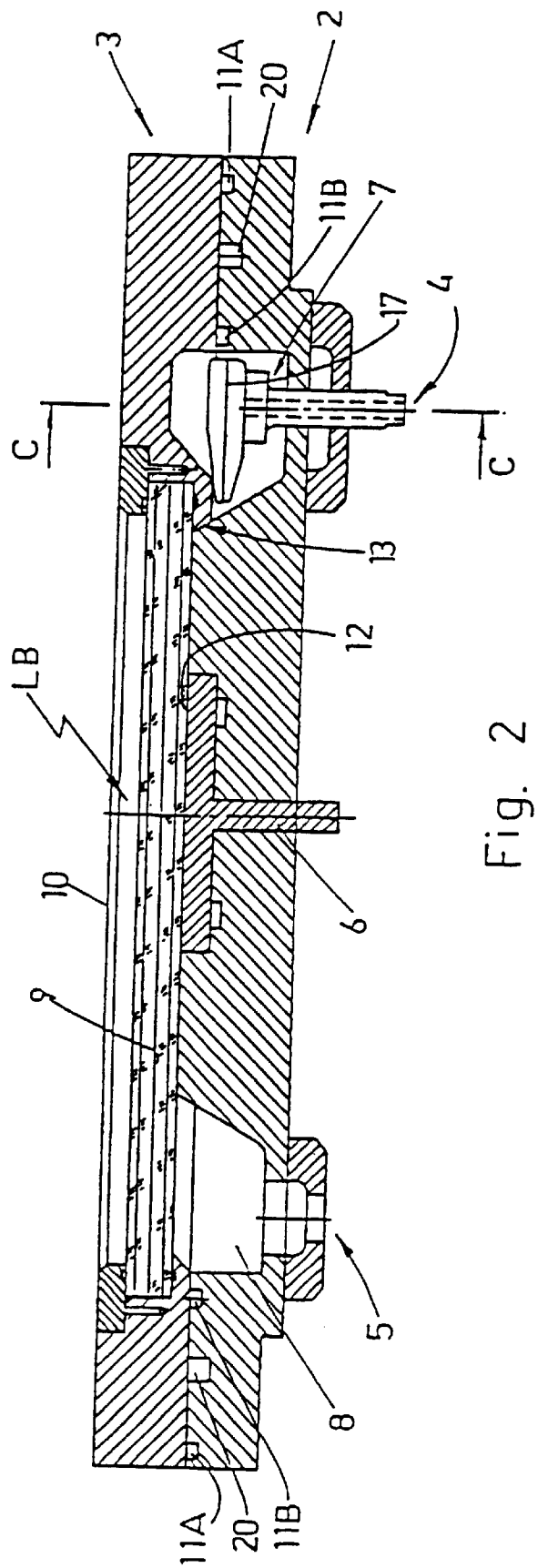
FIG. 2 is cross-section of the same, taken along plane II—II of FIG. 1.

The process chamber, shown in plan view from the bottom in FIG. 2 and in vertical cross-section in FIG. 2, comprises a base 2, and a cover 3, which are connected by air-tight connections (not shown), so that the inner part of the process chamber, defined by the said base 2 and cover 3, can be kept under pressure or vacuum. The base 2 is provided with $N_xO_y$ gas inlet 4, and $O_2/O_3$ inlet, and gas outlet 5, for exhausting gases which have passed through the irradiated zone. The base 2 is further provided with a chuck 6, on which the element to be stripped, e.g., a wafer, is supported. Through the center of chuck 6 vacuum is applied, to hold the wafer in place during the process.

Two seals, 11A and 11B are shown in FIG. 2, which may be, e.g., O-rings. These two seals define two vacuum zones in the process chamber:

a) Zone 1, which defines the ablation environment in the irradiation zone. The pressure is maintained by means of throttle valve connected in a closed loop to a pressure controller. Typical pressure is in the range of 50–2000 mbar. this pressure regime is defined by seal 11B.

b) Zone 2, which defines the pressure in the outside vacuum channel 20 in between seals 11A and 11B.

The pressure in the channel is always much lower than in the process chamber and usually is in the order of a few millibars or typical vacuum obtainable from mechanical vacuum pumps. The outer vacuum channel 20 has two main purposes: to maintain firmly cover 3 through the aid of the atmospheric pressure, and to permit, in case of a leak, the leaking gas to be sucked by the vacuum pump connected to channel 20.

Figure 4:
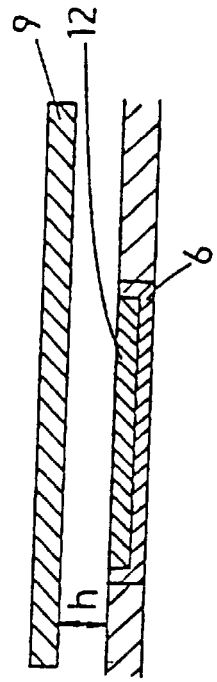
FIGS. 3 and 4 are details illustrating, in the same cross-section, different positions of the wafer to be treated.
Figure 3:
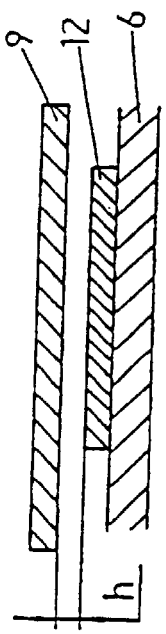

The wafer is positioned above chuck 6 and below window 9, as indicated by numeral 12. Wafer 12 can be positioned on chuck 6 in two ways, as shown in FIGS. 3 and 4. In FIG. 3 the wafer is on top of chuck 6. In FIG. 4 the wafer is immersed inside chuck 6. The wafer does not touch window 9, and there is a distance between them which is preferably kept in the range of 0.2–10 mm. This distance can be varied as long as the product of the values of P×h remains approximately constant, wherein P is the pressure above the wafer and h is the gap, as hereinbefore defined. The pressure referred to above is measured in the center of the process chamber in the irradiation zone.

The space between the window and the wafer defines the ablation cassette cell, through which the gases flow, and in which the ablation products are jetted from the wafer, ignited and combusted. Looking at gas inlet stagnation cell 7, it can be seen that the inflowing gases flow into the ablation cell through a communication opening indicated by numeral 13. The window above the wafer is preferably made of fused silica, to fulfill certain requirements such as optical quality, to permit maximum passage of the incident laser beam (indicated in the figure by the LB arrow), durability, resistance to process gases and temperature, mechanical strength, etc.

The process was operated according to U.S. Pat. No. 5,114,835 and to the aforementioned International publication No. WO 97/17166, using ozone and $N_xO_y$ as the reactive gas. The laser employed was a Lambda Physik LPX315 IMC excimer laser. During the stripping process, the wafer was maintained at 150–250° C. by the chuck, which was externally heated by an electrical resistive heater.

The total pressure in the process chamber was slightly below atmospheric pressure, and the $N_xO_y$ volumetric concentration was varied between 5 and 30%.

Different spots on the wafer were irradiated by different numbers of pulses, and then the wafer was examined by High Resolution Scanning Electron Microscopy (SEM). Complete stripping without residues was not found even after 1500 pulses, which is not a reasonable number of pulses to be used in an industrial process. Even after 1500 pulses, a significant amount of residue in the form of sidewalls could be observed.

EXAMPLE 2 (comparative)

The same operations as in Example 1 were carried out, but with the introduction of chlorine gas into the gas mixture. Different concentrations of $Cl_2$ were tried and the best conditions were found with 15 mbar $Cl_2$ partial pressure. As in Example 1, 1500 pulses were used.

After examination by the SEM, it was found that the process was improved compared to Example 1; however, some sidewalls residue still remained.

EXAMPLE 3 (comparative)

The same operations as in Example 1 were carried out, but with the introduction of fluorine gas into the gas mixture. The $F_2$ was introduced by mixing it with the $O_2/O_3$ gas. Different concentrations of $F_2$ were tried and the best conditions were found with 0.3 mbar partial pressure of $F_2$. As in Example 1, 1500 pulses were used.

After examination by the SEM, it was found that the process was much improved compared to Example 1; however, some few sidewall residues still remained. In addition, evidence of chemical damage of the substrate was also observed by the SEM. This shows the bad selectivity of $F_2$.

EXAMPLE 4

The same operations as in Example 1 were carried out, but with the introduction of $NF_3$ gas into the gas mixture. Different concentrations of $NF_3$ were tried and the best conditions were found with ~800 mbar partial pressure of $NF_3$.

After examination by the SEM, it was found that a complete process without any sidewall residue was found, even when the total number of pulses was below 500. This is an improvement of the throughput by more than three times in comparison with the previous examples, in which 1500 pulses were applied.

EXAMPLE 5

A wafer after via hole RIE was stripped as in Example 4. Complete removal of photoresist and sidewalls was verified by SEM.

EXAMPLE 6

The operations of Example 6 were repeated, but with a wafer after contact hole RIE.

EXAMPLE 7

A 6" Bare Silicon wafer was measured with a particle detector (Tencor 4000 Surfscan) and the number of particulates greater than 0.3 μm was recorded.

Following the measurement, the wafer was treated in a process chamber as described in Example 1. The process was operated according to U.S. Pat. No. 5,114,835 and aforementioned International Publication No. WO 97/17166, using ozone and $N_xO_y$ as the reactive gas, as described in Example 1.

During the process, the wafer was maintained at room temperature.

After the entire wafer was processed, it was tested by the Surfscan and it was found that the number of particles was reduced by approximately 40%.

EXAMPLE 8

The operations of Example 7 were repeated, but the wafer was maintained at 150–250° C. In this case, it was found that about 50% of the particles were removed.

EXAMPLE 9

The operations of Example 8 were repeated, but in addition to the $O_3$ and $N_xO_y$, $NF_3$ was added to the gas mixture as described in Example 4.

In this case, it was found that about 70% of the particles were removed during the process. The wafer was maintained at room temperature.

EXAMPLE 10

The operations of Example 9 were repeated, but the wafer was maintained at 150–250° C. In this case, about 90% of the particles were removed.

EXAMPLE 11

The operations of Example 10 were repeated, but the wafer was subjected to 3–5 passes through the process chamber. In this case, almost all of the particles were removed.

EXAMPLE 12

A 6" wafer, covered with photoresist as in Example 1, was stripped according to the process described in Example 1. After stripping the wafer was checked by Vapor Phase Decomposition Total Reflection X-Ray Fluorescence (VPD-TXRF) and the surface concentration of heavy metals such as Ti, Cr, Fe and Ni was found to be in the range of $10^{11}$–$10^{12}$ atoms/cm$^2$.

EXAMPLE 13

The operations of Example 12 were repeated, but $NF_3$, up to 400 mbars, was added to the gas mixture. After stripping the surface, heavy metal concentrations were found to be reduced up to one order of magnitude.

While specific embodiments of the invention have been described for the purpose of illustration, it will be understood that the invention may be carried into practice by skilled persons with many modifications, variations and adaptations, without departing from its spirit or exceeding the scope of the claims.

What is claimed is:

1. A method of complete laser removal of inorganic and organic foreign material, including particles down to submicron sizes and atomic contaminants, including heavy metals and alkaline elements, from a substrate without any damage to the substrate, said method comprising placing the substrate in a process chamber and causing gases to flow through said chamber while irradiating the substrate surface by UV laser irradiation, wherein said gases comprise at least a first reactive gas selected from the group consisting of NO, $NO_2$, $N_2O_3$, $N_2O_4$, $NO_3$ and $NO_4$, and mixtures thereof, and at least a second gas selected from the group consisting of $SF_4$, NOCl, $CF_3Cl$, $Cl_2O$, and $F_2O$ and wherein inorganic and organic foreign material is removed from the substrate surface.

2. The method according to claim 1, wherein the irradiation is produced by excimer laser.

3. The method according to claim 2, comprising repeated irradiation by excimer lamp or other VUV sources.

4. The method according to claim 1, wherein said second gas produces atoms by thermo-dissociation, wherein said atoms are selected from the group consisting of fluorine, chlorine and mixtures thereof.

5. The method according to claim 1, wherein said second gas is present in an amount up to 95% by volume of the reactive gas mixture.

6. The method according to claim 1, wherein the foreign material to be removed is a thin film.

7. The method according to claim 1, wherein the foreign material to be removed is a photoresist.

8. The method according to claim 7, wherein the substrate is a silicon wafer.

9. The method according to claim 7, wherein the substrate is a Flat Panel Display.

10. The method according to claim 7, wherein the substrate is a compact disc.

11. The method according to claim 7, wherein the substrate is a magnetic head.

12. The method according to claim 7, wherein the substrate is a photomask.

13. The method according to claim 1, wherein the foreign material to be removed is micron and submicron particles.

14. The method according to claim 13, wherein the substrate is a silicon wafer.

15. The method according to claim 13, wherein the substrate is a Flat Panel Display.

16. The method according to claim 13, wherein the substrate is a compact disc.

17. The method according to claim 13, wherein the substrate is a magnetic head.

18. The method according to claim 13, wherein the substrate is a photomask.

* * * * *